United States Patent [19]

Smith

[11] Patent Number: 5,943,370

[45] Date of Patent: Aug. 24, 1999

[54] DIRECT CONVERSION RECEIVER

[75] Inventor: Christoper Nigel Smith, Romsey, United Kingdom

[73] Assignee: Roke Manor Research Limited

[21] Appl. No.: 08/765,686

[22] PCT Filed: May 10, 1995

[86] PCT No.: PCT/GB95/01058

§ 371 Date: Apr. 4, 1997

§ 102(e) Date: Apr. 4, 1997

[87] PCT Pub. No.: WO96/36104

PCT Pub. Date: Nov. 14, 1996

[51] Int. Cl.$^6$ .............................. H03D 3/00; H04L 27/14
[52] U.S. Cl. ........................ 375/334; 329/304; 329/300; 375/331
[58] Field of Search ..................... 375/316, 261, 375/272, 281, 269, 333, 334, 324, 330, 341, 329, 283, 328, 331, 344; 329/300, 304, 303, 310

[56] References Cited

U.S. PATENT DOCUMENTS

| | | | |
|---|---|---|---|
| 3,743,775 | 7/1973 | Hutchinson et al. | 178/88 |
| 4,384,357 | 5/1983 | DeBuda et al. | 375/81 |
| 4,475,220 | 10/1984 | Mattei et al. | |
| 4,559,499 | 12/1985 | Bursztejn et al. | 329/50 |
| 4,570,125 | 2/1986 | Gibson. | |
| 4,682,117 | 7/1987 | Gibson. | |
| 4,795,986 | 1/1989 | Ceroni et al. | 329/304 |
| 4,893,316 | 1/1990 | Janc et al. | 375/44 |
| 4,985,684 | 1/1991 | Jentz et al. | |
| 5,025,455 | 6/1991 | Nguyen | 375/53 |
| 5,042,052 | 8/1991 | Roberts et al. | 375/97 |
| 5,287,351 | 2/1994 | Wall, Jr. | 370/77 |
| 5,640,427 | 6/1997 | Rainish | 375/329 |

Primary Examiner—Jason Chan
Assistant Examiner—Jean B Corrielus
Attorney, Agent, or Firm—Evenson, McKeown, Edwards & Lenahan, P.L.L.C.

[57] ABSTRACT

A direct conversion receiver for a radio system has an antenna and blocking filter connected to an amplifier. The input signal is split and mixed with an in-phase signal and a quadrature phase signal generated by an oscillator in a mixer circuit. An output from each mixer circuit is applied to a low pass filter and to an input of a limiting circuit. The output from each low pass filter is applied to respective circuits, a first of which is arranged to sum the in-phase and quadrature phase signals, and the second of which is arranged to subtract the in-phase and quadrature phase signals to generate a respective output signal having an axis intermediate the in-phase and quadrature phase signal axes. These signals, together with the in-phase and quadrature phase signals are passed through a limiting circuit respectively, to a decoder circuit for recovering the data. The output of the limiting circuits represent signals quantized to eight possible phase states separated by 45°. In an alternative embodiment a ratiometric combiner may be used instead of the summation circuits, particularly for π/4-DQPSK modulation, where the phase excursion per symbol is ±45° or ±135° depending upon the bit pair combination. In the latter embodiment a minimum of eight axes are generated giving sixteen sectors and 22.5° phase resolution.

4 Claims, 3 Drawing Sheets

INPUT SIGNAL

INPUT CAN HAVE ANY PHASE ANGLE

AFTER HARD-LIMITING I & Q

OUTPUT QUANTISED TO ONLY 4 POSSIBLE PHASE STATES

DIRECT CONVERSION RECEIVER

CROSS-REFERENCE TO RELATED APPLICATIONS

This application claims the priority of PCT Application No. PCT/GB95/01058 filed in Great Britain on May 10, 1995, the disclosure of which is expressly incorporated by reference herein.

BACKGROUND OF THE INVENTION

The present invention relates to a direct conversion receiver for use in radio systems.

It is known to use direct conversion in radio receivers which avoid the use of bulky and expensive bandpass IF filters. Also, the use of RF filters is considerably simplified and a complete receiver may be integrated onto a single chip.

In practice, one of the main obstacles to the successful implementation of direct conversion, particularly in the digital communications environment, is a requirement for automatic gain control (AGC). In a direct conversion receiver, AGC must be derived from baseband, which often makes it too slow for use with the bursted signals commonly used in modern digital systems.

Referring to FIGS. 1 and 2, FIG. 1 shows an arrangement which is often used in low data rate paging receivers and includes an antenna 2 connected to an input of a blocking filter 4, the output of which is connected to an input of an amplifier 6. The output of the amplifier is applied to an input of a mixer 8, 10 respectively, which receive at a second input thereof, an output from an oscillator 12. The mixer 8 receives a signal which is at 0° phase from the oscillator 12, and the mixer 10 receives a signal which is at 90° phase from the oscillator 12. The outputs of the mixers 8 and 10 are applied respectively to an input of a low pass filter 14, 16, the output of which is applied to limiters 18, 20 respectively. The output from the limiter 18 is an in-phase signal I, and the output from the limiter 20 is a quadrature phase signal Q. The circuit thus described does not require any AGC.

If the inputs of the receiver is a frequency shift keyed (FSK) signal, it may be represented vectorially as shown in FIG. 2. The left hand diagram of FIG. 2 shows that the input can have any phase angle, whereas the output, after hard limiting, the I and Q signals are quantized to any four possible phase states, as shown in the right hand diagram of FIG. 2.

In order to demodulate the FSK modulation, it is necessary to establish the direction of rotation of the vector. This is straight forward in paging systems where the modulation index is high, since the vector will rotate several cycles for each data bit. The limited I and Q output signals then become a burst of square waves at 90° to each other, either leading or lagging, depending upon the direction of rotation. By comparing the limited I and Q signals in a phase sensitive detector (e.g. a D-Type flip-flop), the polarity of the phase difference, and hence modulation can be recovered.

However, in more spectrally efficient, low modulation index schemes such as Gaussian frequency shift keying (GFSK), the vector can rotate as little as 50° per data bit. This means that the vector can remain entirely within one quadrant, so there is no change at the limiter outputs. In this case the data is not recoverable.

SUMMARY OF THE INVENTION

An aim of the present invention is to provide a direct conversion receiver for use with phase modulation signals, which does not require AGC.

According to the present invention there is provided a receiver comprising means for receiving an input signal transmitted across a radio medium, means for generating an in-phase and a quadrature phase signal from the received input signal and means for generating in-phase and quadrature phase output signals in the form of a burst of hard-limited signals. According to the invention the receiver includes circuit means arranged to generate additional axes intermediate to the in-phase and quadrature phase signal axes, from which a burst of hard-limited signals are generated, and decoding means arranged to receive the bursts of hard-limited signals and arranged to generate data corresponding to the received radio signal.

The circuit means may include first and second summation circuits, the first of which is arranged to sum the in-phase and quadrature phase signals, and the second of which is arranged to subtract the in-phase and quadrature phase signals. In this manner signals are generated with an axis which is intermediate of the in-phase and quadrature phase signal axes.

The circuit means may include a ratiometric combiner arranged to generate eight axes intermediate of the in-phase and quadrature phase signal axes.

Other objects, advantages and novel features of the present invention will become apparent from the following detailed description of the invention when considered in conjunction with the accompanying drawings.

DETAILED DESCRIPTION OF THE INVENTION

Figure 1:
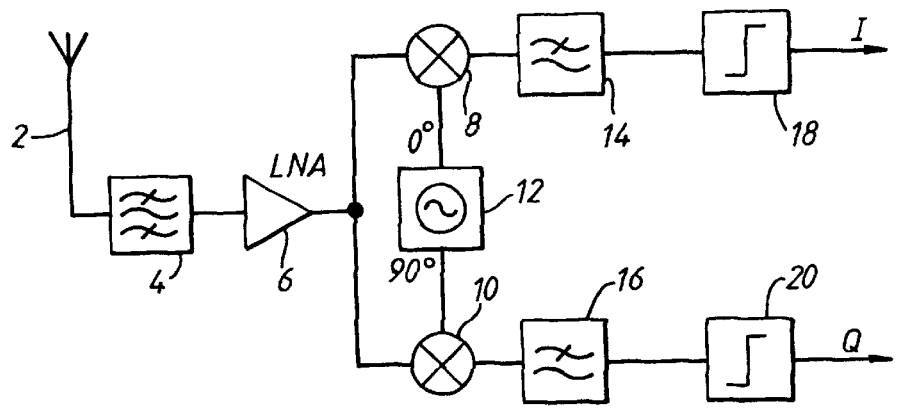
FIG. 1 depicts a prior art receiver circuit.
Figure 2:
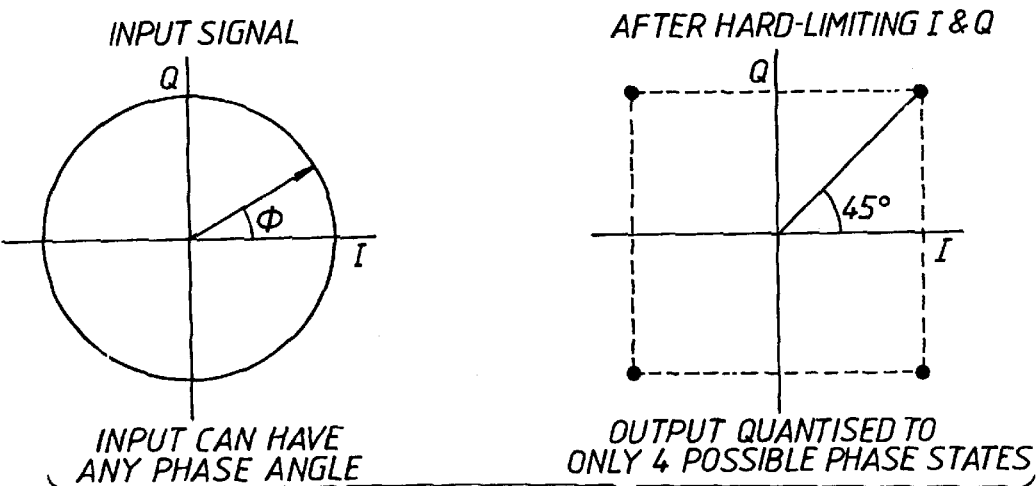
FIG. 2 includes phase diagrams which show the operation of the circuit of FIG. 1.
Figure 3:
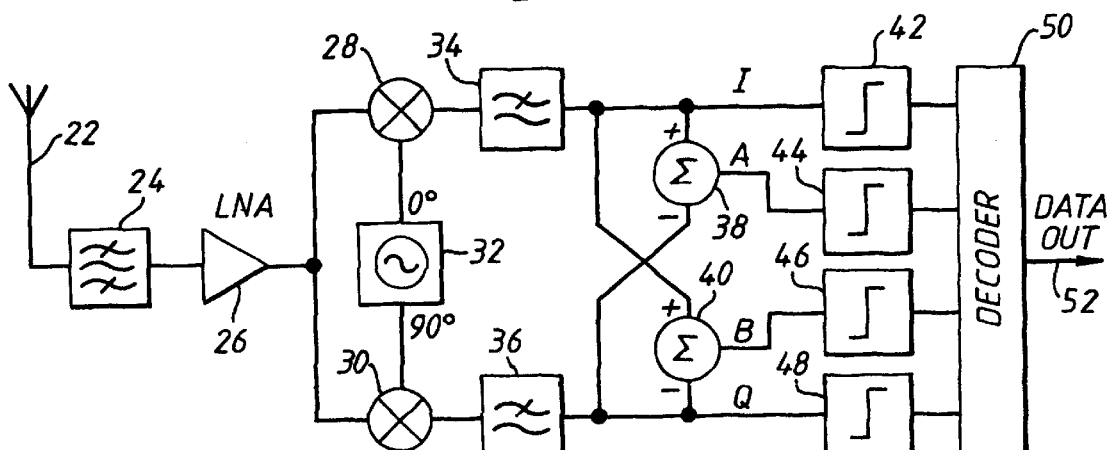
FIG. 3 shows a direct conversion receiver using four limiters.

Referring to FIG. 3, there is shown a block diagram of a direct conversion receiver using four limiters. The receiver as shown overcomes the drawback mentioned with respect to the prior art by effectively introducing additional axes, intermediate to the axes of the in-phase I and quadrature phase Q signals. The simplest realization of this is to add two additional axes at 45° and 135°, by taking the sum and difference of the in-phase I and quadrature phase Q signals, and hard limiting the two new signals designated A and B, as shown in the drawing.

The receiver comprises an antenna 22 connected to a blocking filter 24, the output of which is applied to an amplifier 26. The output of the amplifier is applied to a first input of a mixer circuit 28, 30 respectively. The mixer circuit 28 receives an in-phase signal I from an oscillator 32, and the mixer circuit 30 receives a quadrature phase signal Q from an oscillator 32. An output from each mixer circuit 28, 30 is applied to an input of a low pass filter 34, 36 respectively. The output of the filter 34 represents the in-phase signal and is applied to an input of a limiter 42, an input of a summation circuit 38, and to an input of a summation circuit 40. Similarly the output of the filter 36 which represents the quadrature phase signal, is applied to an input of a limiter 48, a further input of summation circuit 40 and to a further input of the summation circuit 38. The summation circuit 38 generates an output signal A which is the summation of the two input signals, and the summation circuit 40 generates an output signal B which is the difference of the two input signals. The output of the summation circuit 38 is applied to a limiter 44, and the output of the summation circuit 40 is applied to an input of a limiter 46. Each of the limiters 42–48 generate an output signal which is applied to a decoder 50 from which an output data signal is generated on an output line 52.

Figure 4:
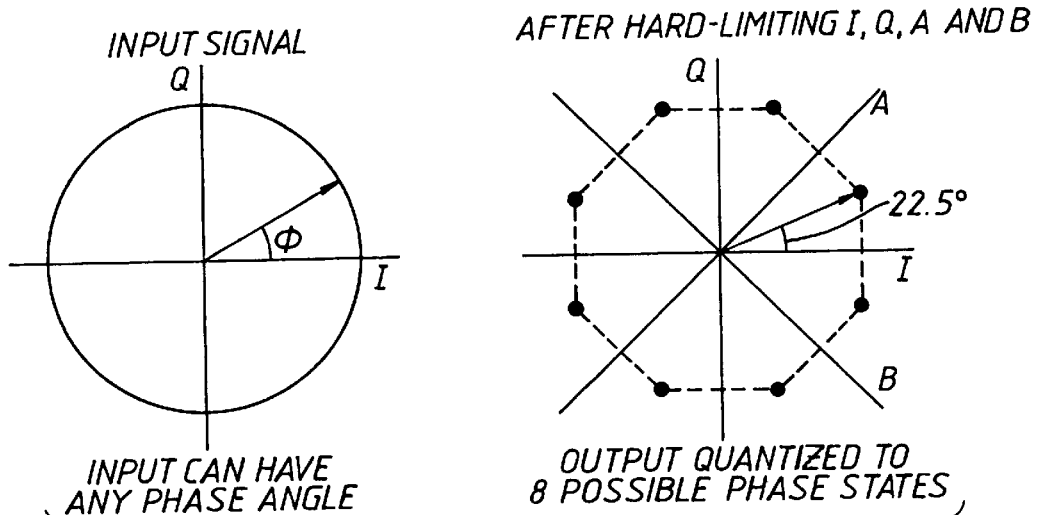
FIG. 4 shows the vector signal representation in a four axis receiver.

The vector diagram in relation to FIG. 3 is shown in FIG. 4. With four axes there are now eight sectors, and the hard limited signals effectively represent the signals quantized to eight possible phase states, separated by 45°. When the input signal is a GFSK modulated signal, the vector will now always cross at least one axis, so the direction of rotation can be established and the data recovered.

With reference to FIG. 4, the left hand diagram shows that the input signal can have any phase angle, and the right hand diagram shows that after hard limiting the output is quantized to eight possible phase states.

Figure 5:
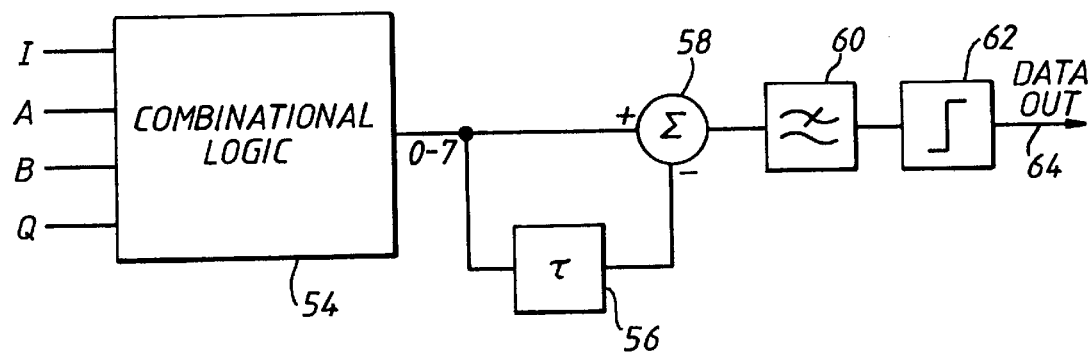
FIG. 5 shows a block diagram of an FSK decoder.

The decoding of the data may be achieved digitally from the binary signals at the outputs of the limiters 42–48 in FIG. 4, and the decoding is shown with reference to FIG. 5. FIG. 5 shows an FSK decoder comprising combinational logic circuit 54 which receives the I, A, B and Q inputs from the limiters 42–48 in FIG. 4. The output of the combinational logic circuit is connected to an input of a delay circuit 56 and to the input of a summation circuit 58. The output of the delay circuit 56 is connected to a further input of the summation circuit 58. The output of the summation circuit 58 is connected to an input of an averaging circuit 60, the output of which is applied to a hard limiter 62 from which data is output on an output line 64.

The simple combinational logic may be used to give a binary sector output from 0 to 7 representing the phase sector in which the signal instantaneously resides. By subtracting the previous sector value from the present sector value (modulo-8 arithmetic), a series of pulses is obtained which are either positive or negative, depending upon the direction of rotation. Effectively, a sampled frequency discriminator is formed. To avoid aliassing, the delay element should be less than half a bit period. The pulse train is then averaged in the circuit 60 and limited by the circuit 62 to extract the data.

In modulation schemes where the phase excursion per bit is even less (such as π/4-DQPSK or GFSK with a very low BT factor where B is the bandwidth of the modulation filter and T is the bit period), the technique can be expanded by introducing more axes, hence improving the phase resolution. This concept is shown in FIG. 6.

Figure 6:
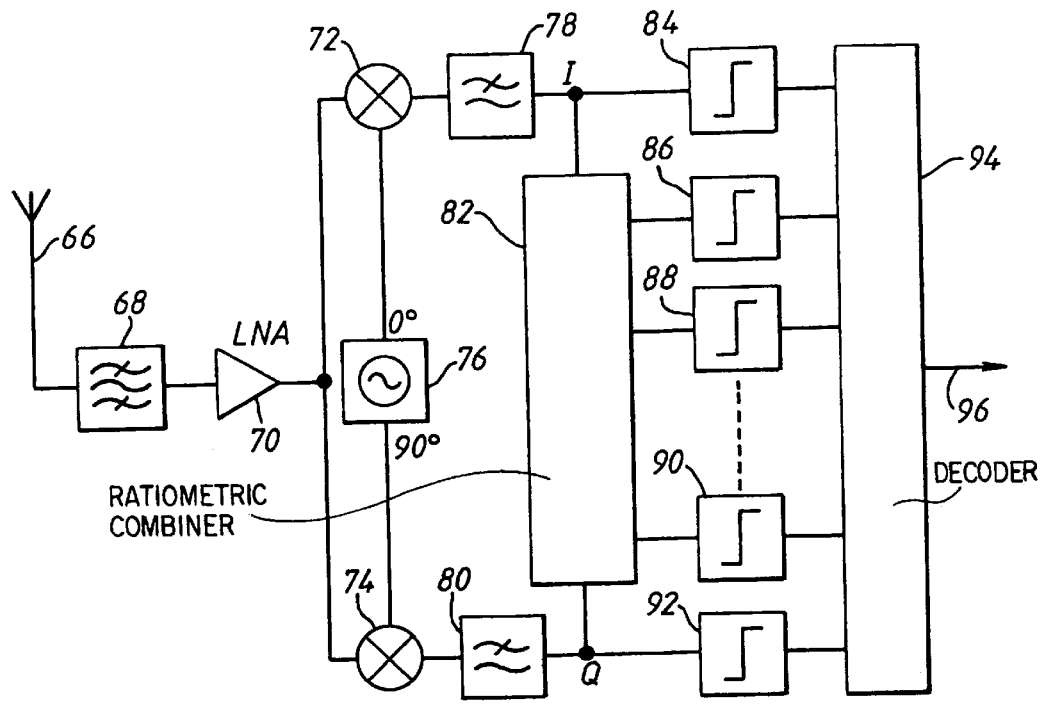
FIG. 6 shows a block diagram of a direct conversion receiver using 'n' limiters; and, FIG. 7 shows a block diagram of a π/4-DQPSK (differential quadrature phase shift keyed) decoder.

Referring to FIG. 6, a further embodiment of the present invention will now be described, and shows a direct conversion receiver using 'n' limiters.

The receiver comprises antenna 66 which feeds an RF filter 68, the output of which is connected to an input of an amplifier 70. The output of the amplifier is applied to the input of a mixer circuit 72 and to an input of a mixer circuit 74. The second inputs of the mixer circuits 72, 74 receive an output from an oscillator 76 in the form of an in-phase signal applied to the mixer circuit 72, and a quadrature phase signal applied to the mixer circuit 74. An output of the mixer circuit 72 is applied to a low pass filter 78, and similarly the output of the mixer circuit 74 is applied a low pass filter 80. The outputs of the filters 78, 80 are each applied to ratiometric combiner 82 respectively, and to an input of a limiter 84 and a limiter 92, respectively. The ratiometric combiner 82 generates a number of output signals, each of which is applied to an input of a limiter 86–90 respectively. An output from each limiter is applied to an input to a decoder circuit 94 which is arranged to generate an output signal on an output line 96.

In π/4-DQPSK modulation, the phase excursion per symbol is ±45° or ±135° depending on the bit pair combination (00, 01, 10 or 11). In the receiver the arrangement as shown in FIG. 6, a minimum of eight axes (and eight limiters) would therefore be required giving sixteen sectors and 22.5° phase resolution. The decoding would also change slightly from the FSK version, since three decision thresholds would be needed to detect the magnitude as well as the polarity of the phase shift. The decoder is shown in FIG. 7.

Figure 7:
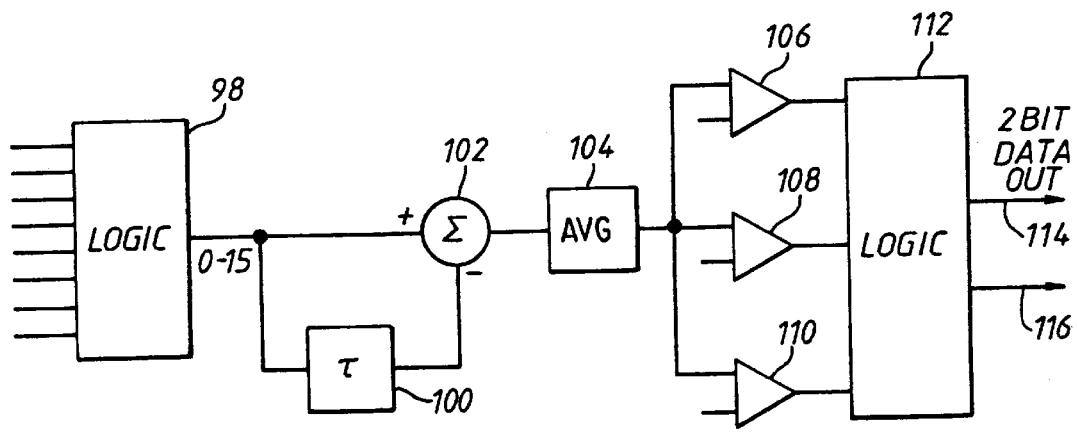

Referring to FIG. 7, a decoder circuit comprises a logic circuit 98 which receives the input signals from the limiter circuits 84–92 (FIG. 6). An output from the logic circuit is applied to the input of a summation circuit 102 and to input of a delay circuit 100. An output from the delay circuit 100 is connected to a further input of the summation circuit 102. An output from the summation circuit 102 is connected to an input of an averaging circuit 104, the output of which is applied to three threshold devices 106, 108, 110, which are arranged to compare the output of the averaging circuit 104 with a threshold signal applied to a second input thereof. The output of each threshold circuit 106–110 is applied to an input of a logic circuit 112, respectively, which is arranged to generate an output data bit on an output line 114, and an output line 116.

It will be appreciated by those skilled in the art that variations and modifications are possible within the scope of the following claims. The receiver is primarily aimed at phase or frequency modulation schemes. However, it will be appreciated that in systems where the envelope variation must be preserved (e.g. for equalization), the signal envelope could be obtained from the limiter received signal strength indicator (RSSI) outputs. As this would be a log-compressed envelope, an anti-log function would be needed to restore the linear amplitude variation.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

I claim:

1. A direct conversion receiver comprising:
   means for receiving an input signal transmitted across a radio medium and represented by a vector;
   means for generating in-phase and quadrature phase signals from the received input signal;
   means for generating in-phase and quadrature phase output signals in the form of first bursts of hard-limited signals;
   circuit means arranged to generate additional axes intermediate to axes of the in-phase and quadrature phase signals, from which additional axes second bursts of hard-limited signals are generated; and
   a decoder circuit arranged to receive the first and second bursts of hard-limited signals and to generate data corresponding to the received input signal; wherein the decoder circuit comprises:

a combination logic circuit arranged to receive said first and second bursts of hard limited signals, and to give a sector output value from zero to seven, when four axes are used, representing a phase sector in which the received input signal instantaneously resides; and means for subtracting a previous sector output value from a present sector output value to generate a series of pulses dependent upon a direction of rotation of the vector.

2. A receiver as claimed in claim 1, wherein the series of pulses are applied to an averaging circuit and to a limiting circuit arranged to extract the data from said series of pulses.

3. A direct conversion receiver comprising:

means for receiving an input signal transmitted across a radio medium and represented by a vector;

means for generating in-phase and quadrature phase signals from the received input signal;

means for generating in-phase and quadrature phase output signals in the form of first bursts of hard-limited signals;

circuit means arranged to generate additional axes intermediate to axes of the in-phase and quadrature phase signals, from which additional axes second bursts of hard-limited signals are generated; and a decoder circuit arranged to receive the first and second bursts of hard-limited signals and to generate data corresponding to the received input signal; wherein the circuit means comprises a ratiometric combiner arranged to generate eight axes intermediate of the in-phase and quadrature phase signal axes;

output signals from the ratiometric combiner, and the in-phase and quadrature phase signals are applied to respective limiting circuits, output signals from which are applied to an input of the decoder circuit respectively; and the decoder circuit includes:

input logic means arranged to receive the output signals from the respective limiting circuits and arranged to generate a sector output signal in the range of 0 to 15, when eight axes are used; and means for subtracting a previous sector output signal from a present sector output signal in order to generate a series of output data pulses.

4. A receiver as claimed in claim 3, wherein the series of output signals are applied to an averaging circuit, the output of which is applied to an input of three decision circuits respectively, and arranged to detect a magnitude and polarity of phase shift, an output of each decision circuit being connected to an output logic circuit arranged to generate data output signals on output data lines.

* * * * *